United States Patent [19]

Jung et al.

[11] Patent Number: 4,964,084

[45] Date of Patent: Oct. 16, 1990

[54] STATIC RANDOM ACCESS MEMORY DEVICE WITH VOLTAGE CONTROL CIRCUIT

[75] Inventors: Tae-Sung Jung, Boochun; Kyu-Hyun Choi, Seoul, both of Rep. of Korea

[73] Assignee: SamSung Electronics Co., Ltd.

[21] Appl. No.: 292,449

[22] Filed: Dec. 30, 1988

[30] Foreign Application Priority Data

Dec. 15, 1988 [KR] Rep. of Korea ................ 1988-16713

[51] Int. Cl.$^5$ ............................................. G11C 11/40
[52] U.S. Cl. .................................... 365/226; 365/228; 365/205; 307/296.8
[58] Field of Search ........ 365/226, 228, 229, 203–208; 307/296.6, 296.8, 272.3

[56] References Cited

U.S. PATENT DOCUMENTS

| | | | |
|---|---|---|---|
| 4,581,545 | 4/1986 | Beale et al. | 307/296.8 |
| 4,585,955 | 4/1986 | Uchida | 365/226 |
| 4,642,488 | 2/1987 | Parker | 307/296.8 |
| 4,658,156 | 4/1987 | Hashimoto | 365/226 |
| 4,694,199 | 9/1987 | Goetz | 307/296.8 |
| 4,769,784 | 9/1988 | Doluca et al. | 365/226 |
| 4,771,407 | 9/1988 | Takemae et al. | 365/226 |
| 4,839,577 | 6/1989 | Gardner | 307/296.8 |

Primary Examiner—James W. Moffitt
Assistant Examiner—Alfonso Garcia
Attorney, Agent, or Firm—Robert E. Bushnell

[57] ABSTRACT

SRAM device having a power supply voltage control circuit capable of preventing the failure of memory cells used for a long period of time, without lowering a power supply voltage is disclosed. The SRAM device includes a plurality of word lines, a plurality of pairs of bit lines, a plurality of memory cells each coupled between a word line and each pair of bit lines, and a power supply regulating stage coupled to each memory cell, for decreasing a supply voltage delivered to each memory cell when an external power supply voltage exceeds a specified voltage level, and delivering the external power supply voltage to each memory cell when the external power supply voltage does not exceed the specified voltage level. If an external power supply voltage is lower than a voltage level Vc, the supply voltage is supplied as a power source of the memory cell. However, when the external power supply voltage exceeds the voltage level Vc, there is supplied a voltage of common power supply line lower than the power supply voltage by a threshold voltage of a MOS transistor.

16 Claims, 4 Drawing Sheets

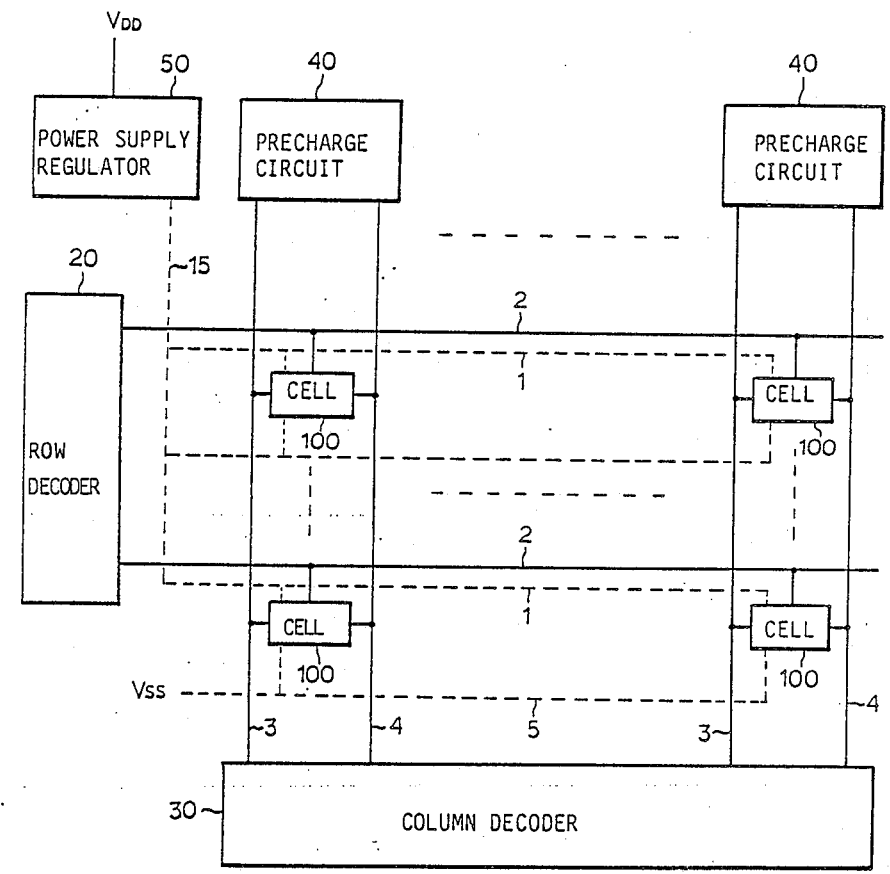
F I G. 2

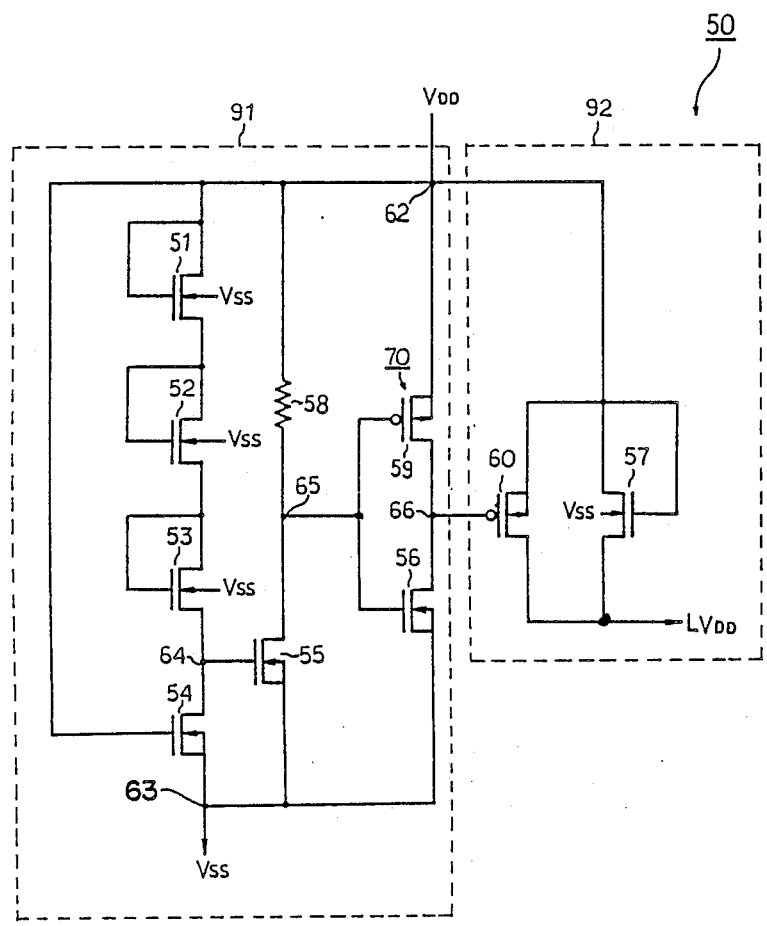
F I G. 3

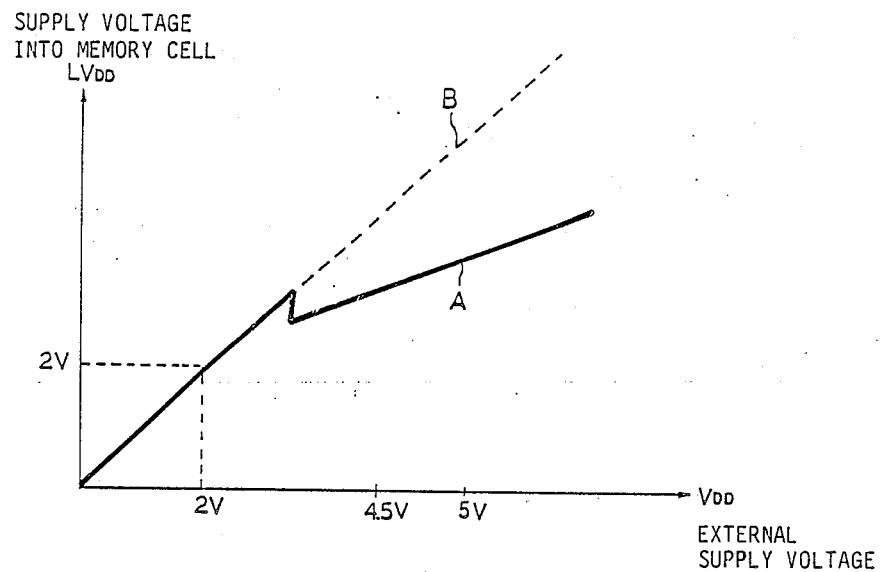
F I G. 4

STATIC RANDOM ACCESS MEMORY DEVICE WITH VOLTAGE CONTROL CIRCUIT

BACKGROUND OF THE INVENTION

1. Field of the Invention

The present invention relates to a Static Random Access Memory (SRAM) device and more particularly to a circuit for controlling a power supply voltage for use in the SRAM device.

2. Description of Prior Arts

The SRAM device, among various other MOS memory devices, has been widely used in the field and manufactured with high integration in its scale. In general, the high integration of the SRAM device continuously requires more scaling-down of memory cells. The SRAM device being currently used, generally adopts 5 volts of external power supply voltage, in which a voltage which is the same as the external power supply voltage is supplied to the internal memory cells of the SRAM device. In such an arrangement, when MOS transistors in the memory cells are continuously supplied with the power supply voltage during a long period of time, there frequently arises a failure problem in the MOS transistors. This drawback can be made worse owing to supplying the external power supply voltage at a higher than a normal power supply voltage, and increasing the memory capacity, thereby consequently leading to a deterioration of reliability in the memory device.

To solve the reliability problem, prior-art technology has disclosed a method in which the internal power supply voltage is lowered to about 3 volts below the 5 volts. However, though the method can reduce the reliability problem of the memory cell according to the power source voltage, there still remain other problems unsolved, such as the decrease of operational speed in the memory device as well as the destruction of data stored in the memory cell, that is, the soft-error, due to the radioactive particle from a package of semiconductor memory device.

SUMMARY OF THE INVENTION

It is, therefore, an object of the present invention to provide a SRAM device having a power supply voltage control circuit capable of preventing the failure of memory cells through use over a long period of time, without lowering a power supply voltage.

To achieve the aforementioned object, the present invention discloses a SRAM device having a plurality of word lines, a plurality of pairs of bit lines, a plurality of memory cells each coupled between said word line and each pair of bit lines, and a power supply voltage regulating stage coupled to each memory cell, for decreasing a supply voltage delivered to each memory cell when an external power supply voltage exceeds a specified voltage level, and delivering the external power supply voltage to said each memory cell when the external power supply voltage does not exceed the specified voltage level.

BRIEF DESCRIPTION OF THE DRAWINGS

FIG. 2 is a block diagram according to the present invention;

FIG. 3 is a schematic circuit diagram of a preferred embodiment according to the present invention; and FIG. 4 is a graph diagram showing every aspect of operation in FIG. 3.

DETAILED DESCRIPTION OF THE INVENTION

Figure 1:
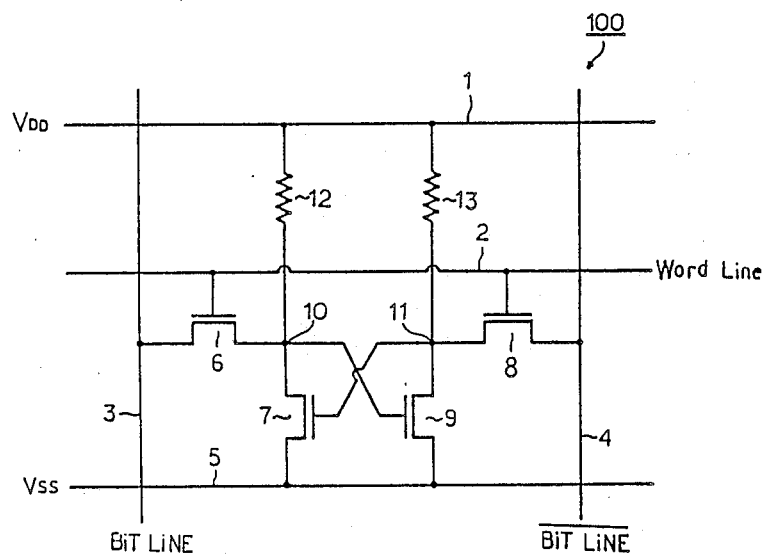
FIG. 1 is an equivalent circuit diagram of a single memory cell according to a conventional SRAM device.

Referring to FIG. 1, there is shown an equivalent circuit of a memory cell in a prior-art SRAM device. The memory cell 100 includes a data node 10 and a complementary data node 11. A first load resistor 12 and a second load resistor 13 each made of the non-doped polycrystalline silicon are respectively coupled between a power supply line 1 of an external source voltage VDD, and the data node 10 and complementary node 11. The memory cell also includes a pair of cross-connected N-channel MOS transistors 7,9. The data node 10 is coupled to a gate of the MOS transistor 9, and the complementary data node 11 is coupled to a gate of the MOS transistor 7. A pair of transfer MOS transistors 6,8 whose gates are each coupled to a word line 2, connect the MOS transistors 7,9 to a pair of bit-lines 3,4, respectively. The nodes 10,11 each are connected to a reference voltage (ground) line 5, through each source-drain path of the transistors 7,9. Now, assuming that logic "0" data is stored in the memory cell 100, the transistor 7 turns ON by the VDD voltage at the node 11, whereas the transistor 9 turns OFF by the ground potential voltage of the node 10. To the contrary, assuming that logic "1" data is stored in the memory cell, the node 10 is at the VDD level, and the node 11 is at the ground level. Also, in the SRAM device in which a pair of bit-lines 3,4 is precharged by the power supply voltage VDD, the power supply voltage VDD may be applied between the source and drain terminals of either one of the transfer transistors 6 or 8. The operation of writing and reading in the memory cell will be not described in this application, since it may be a known technology in the art. Therefore, the voltage difference between each drain and source of the MOS transistors 6–9 forming a memory cell may be the power supply voltage VDD, and supplying such a voltage for a long period of time frequently leads to a failure of the memory cell, owing to the high-voltage variation of the power supply voltage VDD, and the scaling-down of memory cells in the high-integration memory device.

FIG. 2 is a block diagram according to the present invention. A row decoder 20 is coupled to a plurality of word-lines so as to select either one of the word-lines 2, and a column decoder 30 is coupled to a plurality of bit-lines so as to select either one pair of bit-lines 3,4 among the bit-lines. Each memory cell is coupled between a pair of bit-lines 3,4 and a word-line 2, and then a precharge circuit 40 is coupled to each pair of bit-lines 3,4 to precharge each bit-line. A power supply regulator 50 is disposed so that a reduced power supply voltage is supplied to a common power supply line 15 coupled to each power supplying line of the memory cell when the external power supply voltage VDD exceeds a specified voltage. The ground lines of each memory cell 100 are commonly coupled with the ground potential Vss.

FIG. 3 is a schematic circuit diagram according to a preferred embodiment of the present invention. The power supply regulator 50 includes a plurality of enhancement-type N-channel MOS transistors 51–57, enhancement-type P-channel MOS transistors 59,60, and a resistor 58. Each substrate of the transistors 51-56 is coupled to the ground potential line. The drain-source paths of N-channel MOS transistors 51-54 are connected in series between a first node 62 supplied by the power supply voltage VDD, and the ground node 63. Each gate of the transistors 51-53 is coupled to each drain, and the gate of transistor 54 is coupled to the node 62. Also, between the nodes 62 and 63, the drain-source path of the transistor 55 and a current limiting resistor 58 are coupled via a third node 65. The gate of transistor 55 is connected to a second node 64 between the drain of transistor 54 and the source of transistor 53. The third node 65 serves as an input terminal of an inverter 70 including the P-channel MOS transistor 59 and N-channel MOS transistor 56. The output node 66 of inverter 70 is coupled to a gate of P-channel MOS transistor 60, and then each drain-source path of P-channel MOS transistor 60 and N-channel MOS transistor 57 is coupled in parallel between the first node and the common power supplying line 15. The resistor 58 having a number of giga-ohms resistance and made of polycrystalline silicon, serves to limit the current. The transistor 54 has a long channel length, so that the drain current will be small when the transistors 51-53 turn ON. A block 91 including the MOS transistors 51-55, the inverter 70 and the resistor 58 serves as a means for deciding whether the external power supply voltage VDD exceeds a specified voltage or not. Also, another block 92 including the MOS transistors 60,57 serves as a means for regulating the power supply to the memory cell.

The operation of the power supply control circuit according to the present invention will be described, hereinafter. For the purpose of clear understanding, each threshold voltage of the transistors 51-53 will be referred to as VT1, and the threshold voltage of the transistor 55 will be referred to as VT2.

When the power supply voltage VDD goes below a voltage level Vc ($Vc = 3 \cdot VT1 + VT2$), the transistor 55 turns OFF. Thus, the third node 65 is charged, through the resistor 58, into the VDD level, and then the output node 66 of inverter 70 goes to the ground potential, that is, a logic LOW state, by turning ON of the N-channel MOS transistor 56. Therefore, the P-channel MOS transistor 60 turns ON, and the power supply voltage VDD is supplied into the common power line 15 through the transistor 60 itself. Consequently, if the external power supply voltage VDD is lower than that of the voltage level Vc, the supply voltage VDD is supplied as a power supply voltage of the memory cell 100.

However, when the external power supply voltage VDD exceeds the voltage level Vc, all the transistors 51-55 turn ON. Thus, in order to reduce the dissipation current flowing between the first 62 node and the ground node 63, it will be desirable to make the channel length of the transistor 54 as long as possible. Furthermore, it will be desirable to make the resistor 58 with non-doped polycrystalline silicon of high resistance, so that the current flowing through the resistor due to the turning ON of the transistor 55 will be small.

The turning ON of transistor 55 makes the third node 65 be at the ground level Vss, and the output node 66 of inverter 70 becomes the power supply voltage level VDD, that is, logic HIGH state. Thus, the P-channel MOS transistor 60 turns OFF and the N-channel MOS transistor 57 turns ON, when the voltage of common power supply line 15 is lower than that of the power supply voltage VDD, by a threshold voltage VT3 of transistor 57. However, the threshold voltage VT3 will further increase as the voltage of the source of transistor 57, that is, the common supply line 15 goes higher and higher, according to the "Body Effect" in the art. Therefore, the higher the power supply voltage VDD goes, the more a power supply voltage supplied to the memory cell decreases. This decrease in the power supply voltage to the memory cell leads to an effect that the current decreases by one-third ($\frac{1}{3}$) to the stand-by current in the SRAM device in which an external power supply voltage is directly supplied to its memory cells.

FIG. 4 illustrates a schematic graph diagram of the power supply voltage supplied into the memory cell according to the present invention, from which it will be understood that the voltage VDD supplied into the memory cell decreases when the external power supply voltage VDD exceeds the voltage level Vc. Referring to the drawing, a dotted line B shows a power supply voltage supplied into the memory cell according to a conventional SRAM device, whereas a solid line A shows that of the present invention.

As is apparent from the aforementioned description, the SRAM device according to the invention will be capable of protecting the memory cells by a decrease of the power supply voltage to the memory cell when the external supply voltage is received higher than that of a normal state, and improving the reliability thereof in spite of long time use. Furthermore, the invention can achieve the large-scale integration of memory cells due to the scaling-down of memory cells, and finally reduce the stand-by current in the memory cell.

While the invention has been particularly shown and described with reference to a preferred embodiment, it will be understood by those skilled in the art that modifications in detail may be made without departing from the spirit and scope of the invention.

What is claimed is:

1. A static random access memory device comprising:
    a plurality of word lines;
    a plurality of pairs of bit lines;
    a plurality of memory cells each coupled to corresponding ones of said word lines and between each of corresponding ones of said pairs of bit lines, a plurality of N-channel MOS transistors having drain and gate electrodes each coupled together, being connected between a first node and a second node;
    a N-channel MOS transistor having a drain-source path coupled between said second node and a reference voltage node, and having a gate coupled to said first node;
    a resistance coupled between said first node and a third node;
    a third N-channel MOS transistor having a gate coupled to said second node and a drain-source path coupled between said third node and the reference voltage node;
    inverting means coupled between said third node and the gate of P-channel MOS transistors for providing an output signal indicating a relation between an external power supply voltage and a voltage level; and
    means for supplying selectively one of an external power supply voltage and a voltage lower than the external power supply voltage, to each of said memory cells, in response to the output signal.

2. The static random access memory device of claim 1, wherein said supplying means comprises a P-channel MOS transistor and a N-channel MOS transistor having drain-source paths each coupled in parallel between a first node and a common power supply line, a gate of said N-channel MOS transistor being coupled to said first node.

3. The static random access memory device of claim 2, wherein substrate of said P-channel MOS transistor is coupled to said first node, and substrate of said N-channel MOS transistor is coupled to reference voltage node.

4. A static random access memory device, comprising:
 a plurality of word lines;
 a plurality of pairs of bit lines;
 a plurality of memory cells each coupled to corresponding ones of said word lines and between each of corresponding ones of said paris of bit lines;
 power supply voltage regulating means coupled to each said memory cell, for decreasing a supply voltage delivered to each said memory cell when a voltage of an external power supply exceeds a specified voltage level, and for applying the external power supply to each said memory cell when the external power supply voltage does not exceed the specified voltage level;
 said power supply voltage regulating means comprising:
 first means for detecting and providing an output signal indicating whether the voltage of the external power supply exceeds the specified voltage level, and
 second means for supplying selectively one of the external power supply voltage and a voltage lower than the external power supply voltage, to said each memory cell, in response to the output signal of said first means;
 said first means comprising:
 a plurality of N-channel MOS transistors having drain and gate electrodes each coupled together, coupled between said first node and a second node,
 a N-channel MOS transistor having a drain-source path coupled between said second node and the reference voltage node, and a having gate coupled to said first node,
 a resistance coupled between said first node and a third node,
 a third N-channel MOS transistor having a gate coupled to said second node and a drain-source path coupled between said third node and the reference voltage node, and
 inverter means coupled between said third node and an output node, for providing said output signal.

5. The static random access memory device of claim 4, wherein said resistor is formed from a polycrstalline silicon of high resistance.

6. The static random access memory device of claim 4, wherein said resistor is formed from a polycrstalline silicon of high resistance.

7. A static random access memory device, comprising:
 a plurality of word lines;
 a plurality of pairs of bit lines;
 a plurality of memory cells coupled between said word lines and pairs of bit lines;
 a plurality of first ones of a first-conductivity-type channel MOS transistors having drain and gate electrodes each coupled together with said plurality of first transistors coupled between a first node and a second node;
 a second one of said first conductivity-type channel MOS transistor having a drain-source path coupled between said second node and the reference voltage node, and having a gate coupled to said first node;
 an impedance coupled between said first node and a third node;
 a third one of said first conductivity-type MOS transistor having a gate coupled to said second node and a drain-source path coupled between said third node and a reference voltage node;
 inverter means coupled between said third node and an output node, for providing an output signal at said output node indicative of a relation between a power supply and a reference potential; and
 means for supplying selectively one of the power supply voltage and a voltage lower than the power supply voltage, to said each of said memory cells, in response to the output signal.

8. The static random access memory device of claim 7, wherein said inverter means comprises a P-channel MOS transistor and a N-channel MOS transistor having drain-source paths are coupled in parallel between a first node and a common power supply line, a gate of said N-channel MOS transistor being coupled to said first node.

9. The static random access memory device of claim 8, wherein substrate of said P-channel MOS transistor is coupled to said first node, and substrate of said N-channel MOS transistor is coupled to reference voltage node.

10. The static random access memory device of claim 9, wherein said impedance is formed from a polycrystalline silicon layer exhibiting a high resistance.

11. A random access memory device, having a plurality of memory cells, comprising:
 a plurality of first of a first-conductivity-type transistors having drain and gate electrodes each coupled together, coupled between a first node and a second node;
 a second first-conductivity-type transistor having a drain-source path coupled between said second node and a reference node, and a having gate coupled to said first node;
 an impedance coupled between said first node and a third node;
 a third first-conductivity-type channel transistor having a gate coupled to said second node and a drain-source path coupled between said third node and the reference node, and
 inverter means coupled between said third node and an output node, for providing an output signal indicating a relation between a first supply voltage and a reference voltage; and
 means for supplying to said plurality of memory cells, one of said first supply voltage and a second supply voltage having an amplitude different than said first supply voltage, in response to said output signal.

12. The random access memory device of claim 11, wherein said inverter means comprises:
 a first of a second-conductivity-type channel transistor having a source-drain path coupled between said first node and output node, and a gate coupled to said third node; and a fourth first conductivity-type channel transistor having a source-drain path coupled between said output node and reference node.

13. The random access memory device of claim 12 further comprises of a first of a substrate of said first second-conductivity-type channel transistor is coupled to said first node, and substrate of said fourth first-conductivity-type channel transistor is coupled to said reference node.

14. The random access memory device of claim 12, wherein said supplying means comprises:

a second second-conductivity-type channel transistor having a gate coupled to said output node;
a fifth first-conductivity-type channel transistor;
said first second-conductivity-type channel transistor and fourth first-conductivity-type channel transistor having drain-source paths being coupled in parallel between said first node and said plurality of memory cells.

15. The random access memory device of claim 11, wherein said supplying means comprises:

a first of a second-conductivity-type channel transistor having a gate coupled to said output node;
a fourth first-conductivity-type channel transistor;
said first second-conductivity-type channel transistor and fourth first-conductivity-type channel transistor having drain-source paths being coupled in parallel between said first node and said plurality of memory cells.

16. The random access memory device of claim 15, further comprised of a substrate first of said second-conductivity-type channel transistor is coupled to said first node, and substrate fourth of said first-conductivity-type channel transistor is coupled to said reference node.

* * * * *